United States Patent
Wang

(10) Patent No.: US 7,633,418 B2
(45) Date of Patent: Dec. 15, 2009

(54) SIGMA-DELTA MODULATOR AND AN OUTPUT RATE REDUCTION METHOD THEREOF

(75) Inventor: Wen-Chi Wang, Yun-Lin Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 429 days.

(21) Appl. No.: 11/745,470

(22) Filed: May 8, 2007

(65) Prior Publication Data

US 2008/0111725 A1    May 15, 2008

(30) Foreign Application Priority Data

May 8, 2006    (TW) ............................. 95116319 A

(51) Int. Cl.
*H03M 3/00*    (2006.01)
(52) U.S. Cl. ..................... 341/143; 341/118; 341/120; 341/155
(58) Field of Classification Search ......... 341/118–122, 341/143, 155
See application file for complete search history.

(56) References Cited

U.S. PATENT DOCUMENTS

| | | | |
|---|---|---|---|
| 3,931,596 A | 1/1976 | Gersho | |
| 5,745,061 A * | 4/1998 | Norsworthy et al. | 341/131 |
| 6,344,811 B1 * | 2/2002 | Melanson | 341/143 |
| 6,407,689 B1 * | 6/2002 | Bazarjani et al. | 341/143 |
| 6,445,732 B1 * | 9/2002 | Beamish et al. | 375/224 |
| 6,462,685 B1 * | 10/2002 | Korkala | 341/131 |
| 6,504,863 B1 * | 1/2003 | Hellmark | 375/219 |
| 6,515,604 B2 * | 2/2003 | Delano | 341/143 |
| 7,289,050 B1 * | 10/2007 | Laroia et al. | 341/143 |
| 7,496,151 B2 * | 2/2009 | Matsuura et al. | 375/295 |
| 2001/0042152 A1 * | 11/2001 | Kobayashi | 710/126 |
| 2003/0128143 A1 * | 7/2003 | Yap et al. | 341/143 |
| 2005/0024245 A1 * | 2/2005 | Sit et al. | 341/119 |
| 2008/0068240 A1 * | 3/2008 | Matsuura | 341/143 |

FOREIGN PATENT DOCUMENTS

JP    2003-332867 A    11/2003

OTHER PUBLICATIONS

Gaalaas, Integrated Stereo Delta-Sigma Class D Amplifier, Feb. 2005, pp. 120-121 & 588, ISSCC 2005 Paper Continuations/ Session 6/ High-Speed and Oversampled DACs/ 6.6, 2005 IEEE International Solid-State Circuits Conference.

* cited by examiner

*Primary Examiner*—Linh V Nguyen
(74) *Attorney, Agent, or Firm*—Winston Hsu

(57) ABSTRACT

A sigma-delta modulator and an output rate reduction method are disclosed. The sigma-delta modulator comprises an integrator, an analog-to-digital converter, and a controller. An input signal is received by the integrator to generate an integrated signal. The integrated signal is then converted by the analog-to-digital converter into a digital modulation signal. The input signal is received by the controller to calculate an input signal power. The analog-to-digital converter can be controlled by the controller based on a predetermined power value and a sum of the input signal power and a total quantization error power. By the way mentioned above, the out rate of the sigma-delta modulator is reduced.

21 Claims, 6 Drawing Sheets

SIGMA-DELTA MODULATOR AND AN OUTPUT RATE REDUCTION METHOD THEREOF

BACKGROUND OF THE INVENTION

1. Field of the Invention

The present invention relates to a sigma-delta modulator, and more particularly, to a sigma-delta modulator and an output rate reduction method.

2. Description of the Prior Art

Efficiency of conventional class A or class B amplifiers is usually less than 60%, and thus large-sized thermal diffuser is necessarily disposed. Digital amplifiers are more generally utilized because digital amplifiers amplify signals by switching techniques with efficiency up to more than 90%. Therefore, the large-sized thermal diffuser is no longer needed and the digital amplifier can be made very small.

The conventional digital amplifiers mostly use Pulse Width Modulation (PWM) with carrier signals. Therefore, the output spectrum of the digital amplifier includes carrier frequencies and sidebands, and which cause electromagnetic interference (EMI). To suppress EMI, PWM can be replaced by a sigma-delta modulator as the output spectrum of the sigma-delta modulator is similar to white noise. However, the data output rate of the sigma-delta modulator is higher than that of PWM, and which causes more switch loss in the digital amplifier.

SUMMARY OF THE INVENTION

To prevent the above mentioned problems, a sigma-delta modulator and an output rate reduction method is thus disclosed. The sigma-delta modulator and the method can be utilized in a digital amplifier to reduce switch loss.

These and other objectives of the present invention will no doubt become obvious to those of ordinary skill in the art after reading the following detailed description of the preferred embodiment that is illustrated in the various figures and drawings.

DETAILED DESCRIPTION

The sigma-delta modulator and an output rate reduction method according to embodiments of the present invention will be described in detail below accompanied drawings.

Figure 1:
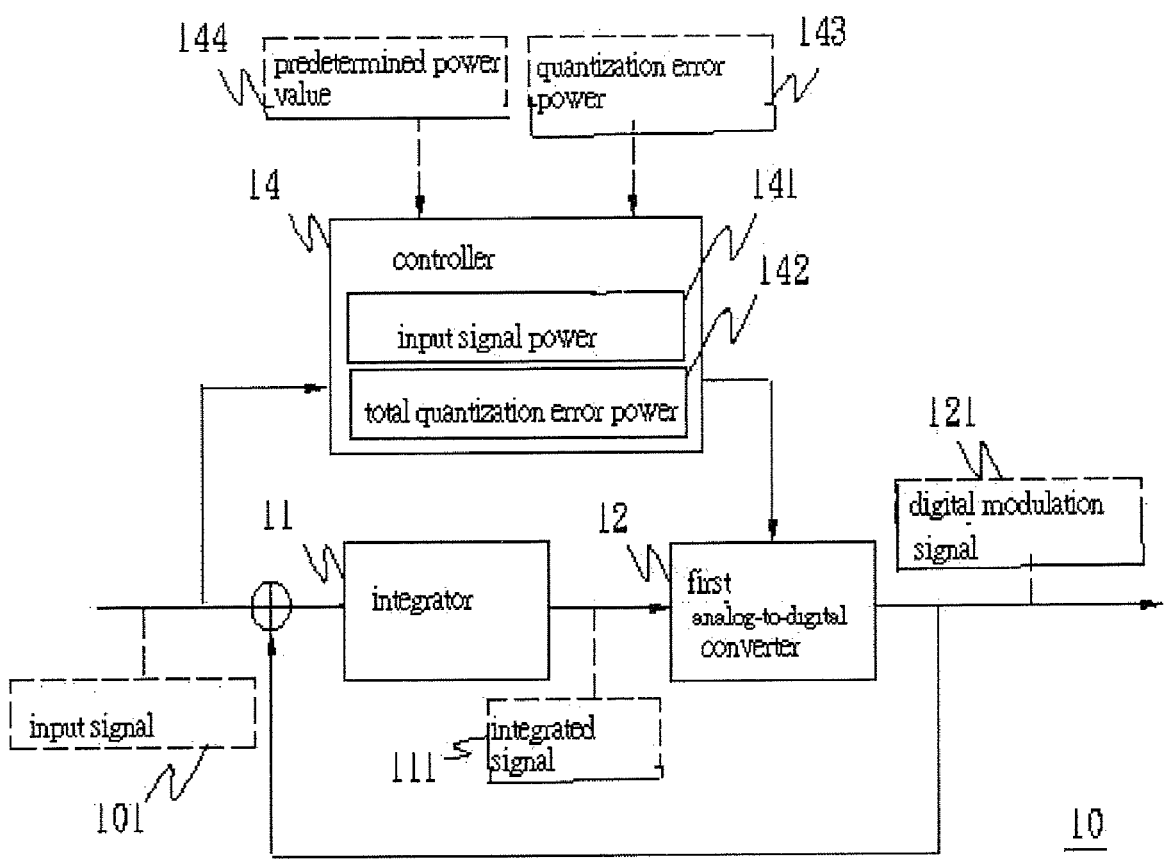
FIG. 1 is a block diagram of a sigma-delta modulator according the present invention.

Referring to FIG. 1, FIG. 1 is a block diagram of a sigma-delta modulator according the present invention. The sigma-delta modulator 10 includes an integrator 11, a first analog-to-digital converter (ADC) 12, and a controller 14. The integrator 11 receives an input signal 101 and generates an integrated signal 111 accordingly. The first ADC 12 is electrically coupled to the integrator 11 and converts the integrated signal 111 into a digital modulation signal 121 with feedback to the integrator 11. The controller 14 is electrically coupled to the first ADC 12 to receive the input signal 101 for calculating an input signal power 141, and the controller 14 controls the first ADC 12 according to a summation of the input signal power 141 and a total quantization error power 142, and a predetermined power value 144. When the summation is less than the predetermined power value 144, the controller 14 locks the first ADC 12 and sets the total quantization error power 142 for an accumulated quantization error power 143 multiplied by a noise power gain, where the quantization error power can be represented by $\Delta^2/12$. The equation of the mentioned accumulation of the quantization error power 143 is presented below:

$$Eq(i)=Eq(i-1)+\Delta^2/12.$$

When the summation is no less than the predetermined power value 144, the controller 14 unlocks the first ADC 12, the quantization error power returns to $\Delta^2/12$, and the total quantization error power 142 equals $\Delta^2/12$ multiplied by the noise power gain. Please note that in this embodiment, the predetermined power value 144 is the maximum output signal power of the first ADC 12, but the scope of the present invention is not limited to this embodiment and the predetermined value can vary with the design.

If the first ADC 12 is locked, the digital modulation signal 121 will be fixed by the first ADC 12, meaning that the digital modulation signal 121 does not vary with the integrated signal 111. If the first ADC 12 is unlocked, the first ADC 12 will operate normally, meaning that the digital modulation signal 121 varies with the integrated signal 111. In addition, the sigma-delta modulator 10 further includes a clock unit to provides the controller 14 and the first ADC 12 with a clock signal.

The above mentioned first ADC 12 can be implemented with a bit quantizer, where the digital modulation signal 121 is a bit signal and the input signal 101 is either an analog signal or a digital signal. If the input signal 101 is an analog signal, the integrator 11 can be implemented with an analog integrator and a sampler, the controller 14 with a second ADC, a power look-up table, and state controller. If the input signal 101 is a digital signal, the integrator 11 can be implemented with a digital integrator, the controller 14 with a power calculating unit and a state controller.

Figure 2:
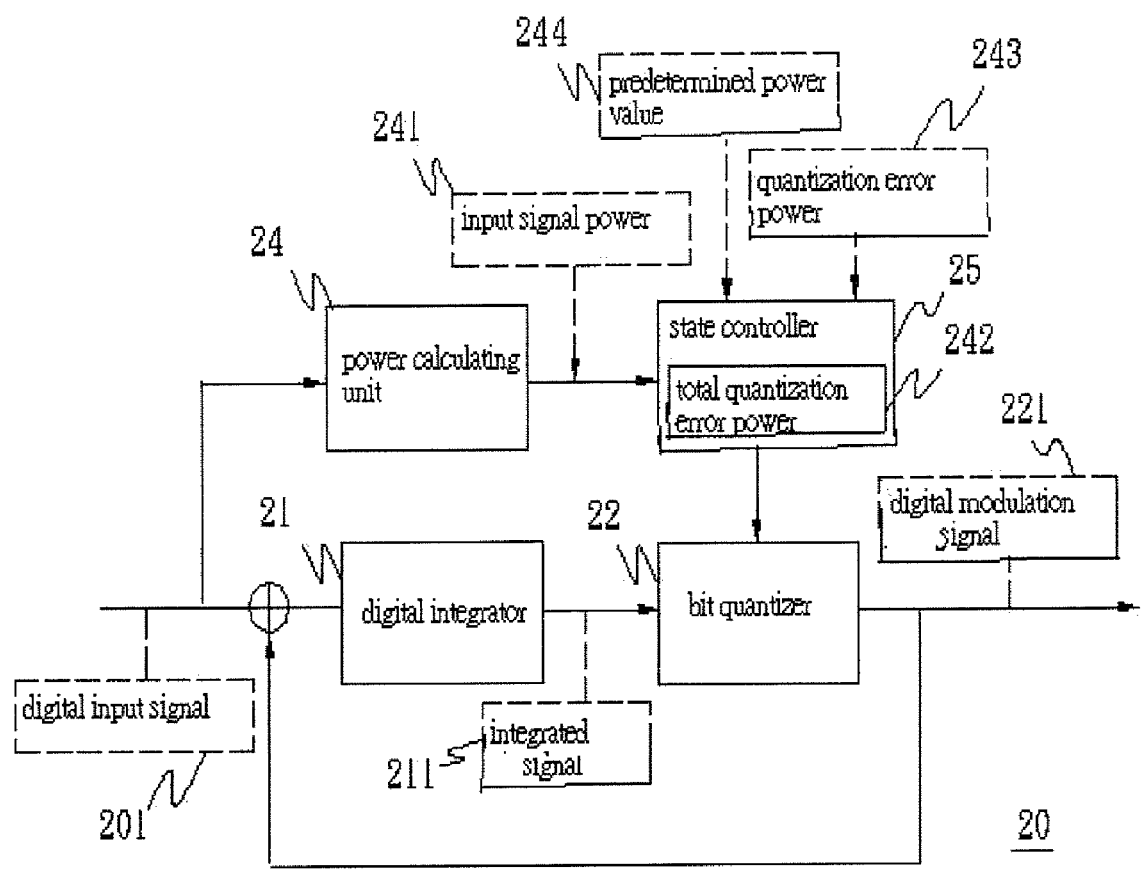
FIG. 2 is a block diagram of a sigma-delta modulator according to a first embodiment of the present invention.

Referring to FIG. 2, FIG. 2 is a block diagram of a sigma-delta modulator according to a first embodiment of the present invention. The sigma-delta modulator 20 receives a digital signal. The sigma-delta modulator 20 includes a digital integrator 21, a bit quantizer 22, a power calculating unit 24, and a state controller 25. The digital integrator 21 receives a digital input signal 201 and generates an integrated signal 211. The bit quantizer 22 converts the integrated signal 211 into a digital modulation signal 221 and has a feedback to the digital integrator 21. The power calculating unit 24 receives the digital input signal 201 and calculates a input signal power 241. The state controller 25 controls the bit quantizer 22 according to a summation of the input signal power 241 and a total quantization error power 242, and a predetermined power value 244. When the summation is less than the predetermined power value 244, the state controller 25 locks the bit quantizer 22, meaning that the output of the bit quantizer 22 has no transition, and the total quantization error power 242 equals an accumulated quantization error power 243 multiplied by a noise power gain. On the other hand, when the summation is no less than the predetermined power value 244, the state controller 25 unlocks the bit quantizer 22, meaning that the bit quantizer 22 operates normally. Then, the quantization error power 243 returns to $\Delta^2/12$ and the total quantization error power 242 equals $\Delta^2/12$ multiplied by the noise power gain.

Figure 3:
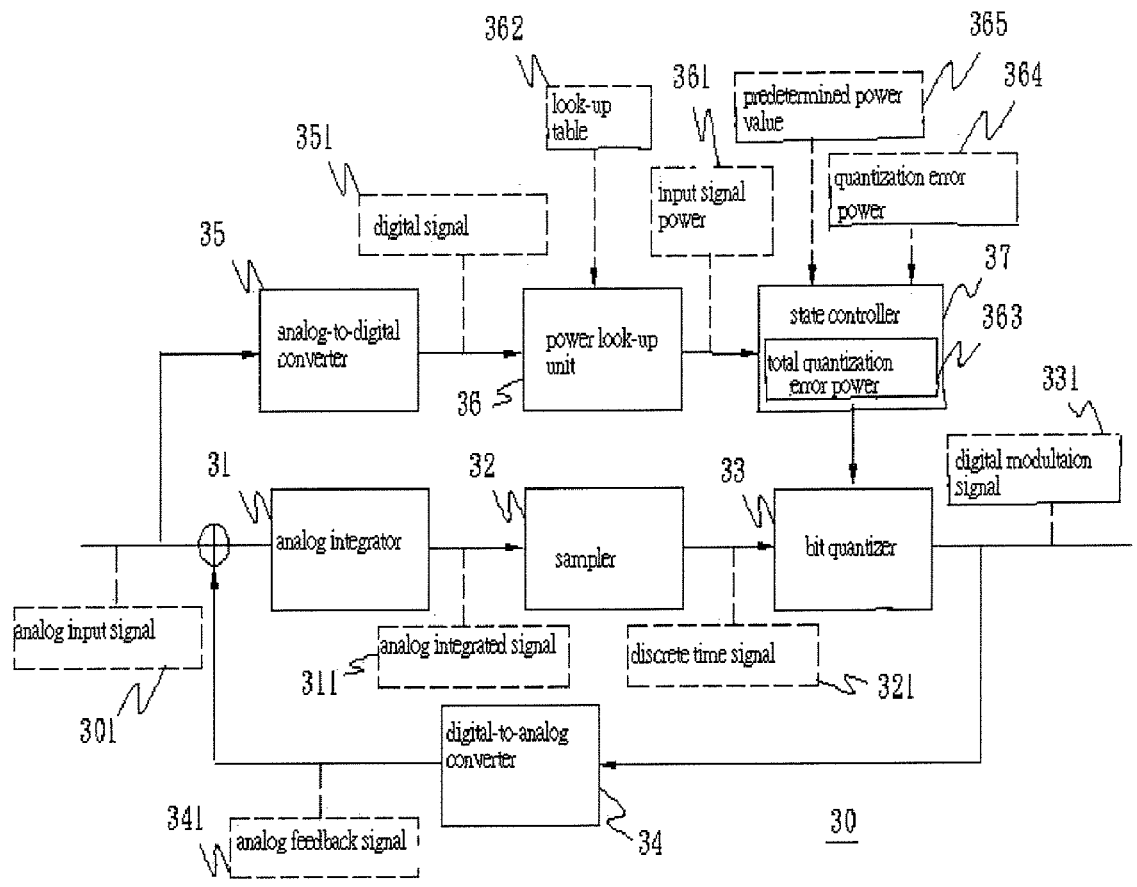
FIG. 3 is a block diagram of a sigma-delta modulator according to a second embodiment of the present invention.

Referring to FIG. 3, FIG. 3 is a block diagram of a sigma-delta modulator according to a second embodiment of the present invention. The sigma-delta modulator 30 receives an analog signal. The sigma-delta modulator 30 includes an analog integrator 31, a sampler 32, a bit quantizer 33, a digital-to-analog converter (DAC) 34, an analog-to-digital converter 35, a power look-up unit 36, and a state controller 25. The analog integrator 31 receives an analog input signal 301 and generates an analog integrated signal 311. The sampler 32 samples the analog integrated signal 311 to generate a discrete time signal 321. The bit quantizer 33 converts the discrete time signal 321 into a digital modulation signal 331. The DAC 34 converts the digital modulation signal 331 into an analog feedback signal 341 to the analog integrator 31. The ADC 35 receives the analog input signal 301 and converts the analog input signal 301 into a digital signal 351. The power look-up unit 36 receives the digital signal 351 and generates a input signal power 361 according to a look-up table 362. The state controller 37 controls the bit quantizer 33 according to a summation of the input signal power 361 and a total quantization error power 363, and a predetermined power value 365. When the summation is less than the predetermined power value 365, the state controller 37 locks the bit quantizer 33. The total quantization error power 363 equals an accumulated quantization error power 364 multiplied by a noise power gain. On the other hand, when the summation is no less than the predetermined power value 365, the state controller 37 unlocks the bit quantizer 33. Then, the quantization error power 364 returns to $\Delta^2/12$. The state controller 37 sets the total quantization error power 363 for $\Delta^2/12$ multiplied by the noise power gain, and the predetermined power value 365 for the maximum output power of the sigma-delta modulator 30. The look-up table 362 stores the relationships between the digital signal 351 and its corresponding power. Please also note that in this embodiment, the setting of the predetermined power value 365 is simply an example, and the scope of the present invention is not limited to this embodiment and the setting can vary with the design.

Figure 4:
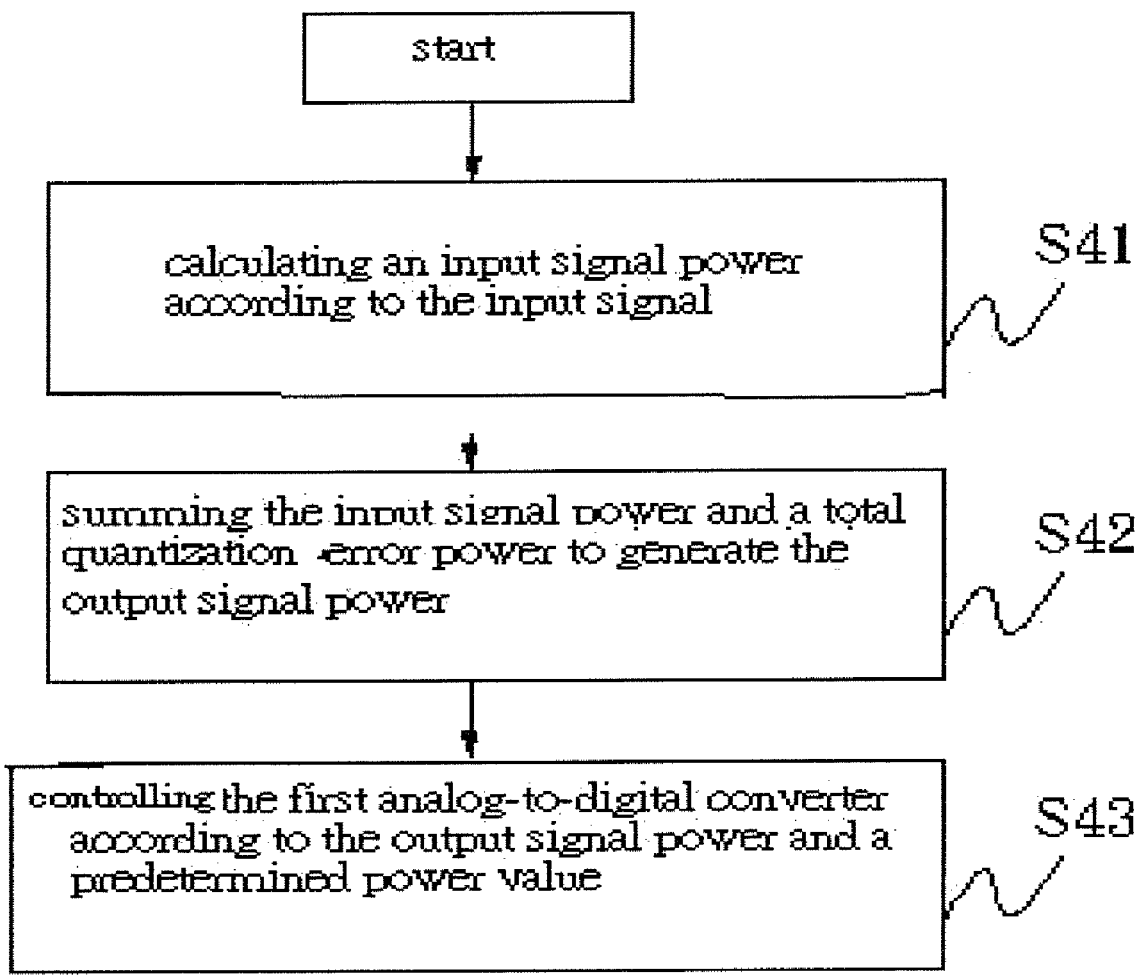
FIG. 4 is a flow chart corresponding to FIG. 1.

Referring to FIG. 4, FIG. 4 is a flow chart corresponding to FIG. 1. The sigma-delta modulator 10 receives an input signal 101. In step S41, a input signal power 141 is calculated and obtained according to the input signal 101. In step S42, a output signal power is obtained by summing the input signal power 141 and a total quantization error power 142. In step S43, the first ADC 12 is controlled according to the output signal power and a predetermined power value 144.

When the above mentioned output signal power is less than the predetermined power value 144, the first ADC 12 is locked, and the total quantization error power 142 equals the accumulated quantization error power 143 multiplied by the noise power gain. On the other hand, when the above mentioned output signal power is no less than the predetermined power value 144, the first ADC 12 is unlocked. The quantization error power 143 returns to $\Delta^2/12$, and the total quantization error power 142 equals $\Delta^2/12$ multiplied by the noise power gain. Please note that in this embodiment, the predetermined power value 144 is the maximum output signal power of the first ADC 12, but the scope of the present invention is not limited to this embodiment and the predetermined value can vary with the design. In addition, if the first ADC 12 is locked, the digital modulation signal 121 is fixed; if the first ADC 12 is unlocked, the first ADC 12 will operate normally.

Please note that the implementation of each device in the above flow chart has been well described in FIG. 1, and the scope of the present invention is not limited to the mentioned embodiments.

Figure 5:
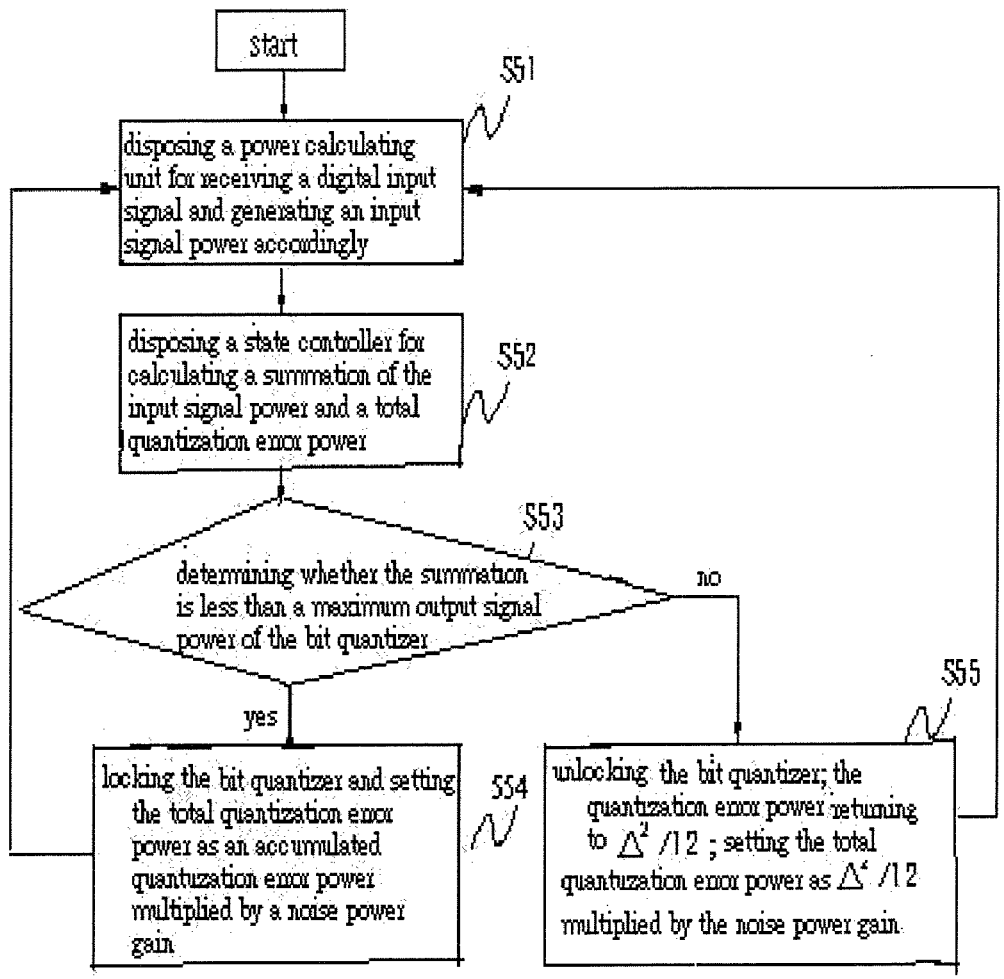
FIG. 5 is a flow chart corresponding to the first embodiment in FIG. 2.

Referring to FIG. 5, FIG. 5 is a flow chart corresponding to the first embodiment in FIG. 2. The sigma-delta modulator 20 receives a digital input signal 201. In step S51, a power calculating unit 24 is disposed and the power calculating unit 24 receives the digital input signal 201 and calculates an input signal power 241. In step S52, a state controller 25 is disposed electrically coupled to the ADC, for calculating a summation of the input signal power 241 and a total quantization error power 242. In step S53, the state controller 25 determines whether the summation is less than the maximum output signal power of the bit quantizer 22. In step S54, if the summation is less than the maximum output signal power of the bit quantizer 22, the bit quantizer 22 is locked; the total quantization error power 242 equals the accumulated quantization error power 243 multiplied by the noise power gain; back to step S51. In step S55, if the summation is no less than the maximum output signal power of the bit quantizer 22, the bit quantizer 22 is unlocked; the quantization error power 243 returns to $\Delta^2/12$, and the total quantization error power 242 equals $\Delta^2/12$ multiplied by the noise power gain; back to step S51.

Figure 6:
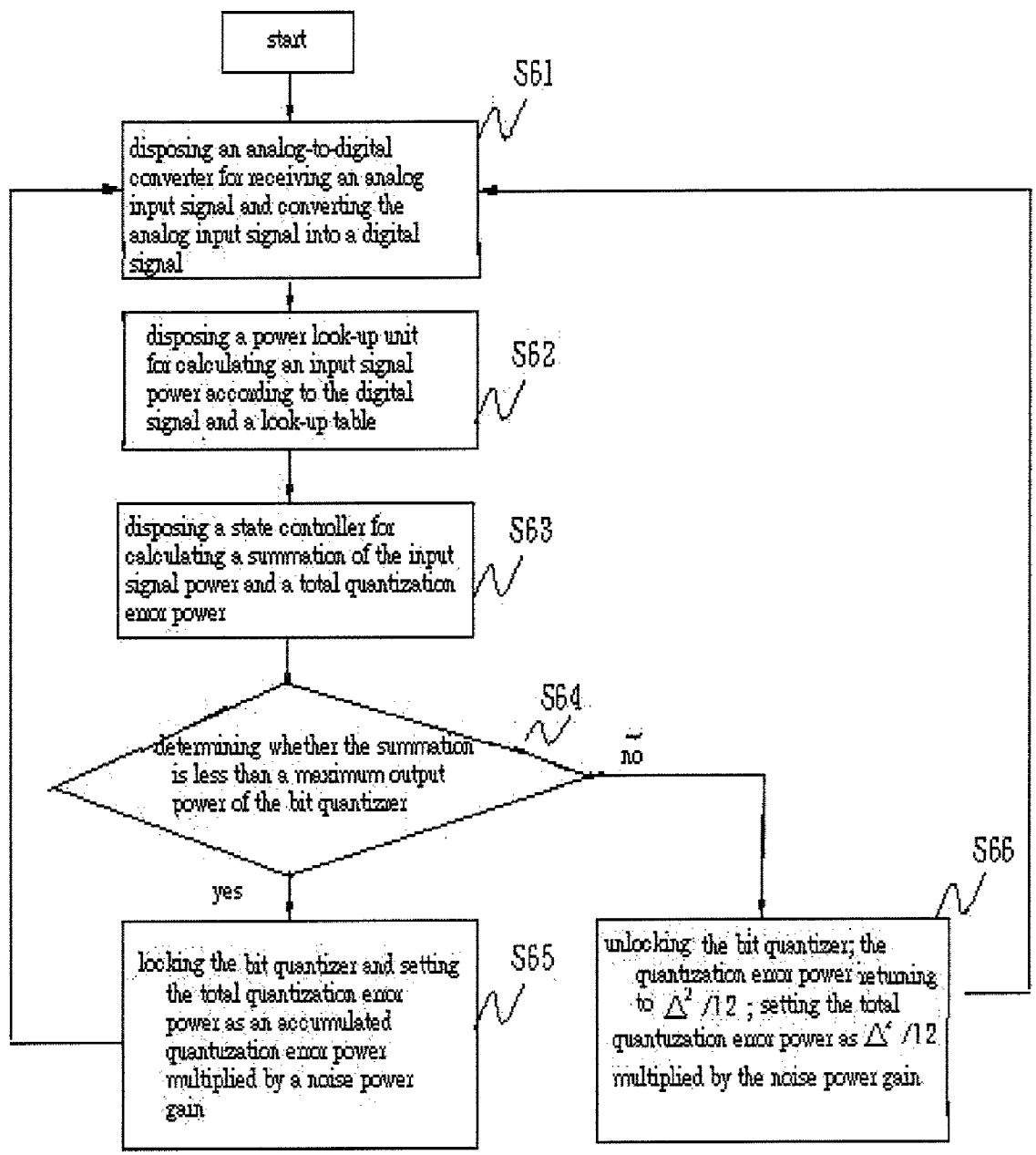
FIG. 6 is a flow chart corresponding to the second embodiment in FIG. 3.

Referring to FIG. 6, FIG. 6 is a flow chart corresponding to the first embodiment in FIG. 3. The sigma-delta modulator 30 receives an analog input signal 301. In step S61, an ADC is disposed; the ADC receives the analog input signal 301 and converts the analog input signal 301 into a digital signal. In step S62, a power look-up unit 36 is disposed electrically coupled to the ADC, for calculating an input signal power 361 according to a look-up table 362 and the digital signal. In step S63, a state controller 37 is disposed electrically coupled to the ADC, for calculating a summation of the input signal power 361 and a total quantization error power 363. In step S64, the state controller 37 determines whether the summation is less than the maximum output power of the bit quantizer 33. In step S65, if the summation is less than the maximum output power of the bit quantizer 33, the bit quantizer 33 is locked; the total quantization error power 363 equals an accumulated quantization error power 364 multiplied by a noise power gain; back to step S61. In step S66, if the summation is no less than the maximum output power of the bit quantizer 33, the bit quantizer 33 is unlocked; the quantization error power 364 returns to $\Delta^2/12$, and the total quantization error power 363 equals $\Delta^2/12$ multiplied by the noise power gain; back to step S61.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sigma-delta modulator, comprising:
   an integrator, for receiving an input signal to generate an integrated signal;
   a first analog-to-digital converter, for converting the integrated signal into a digital modulation signal; and
   a controller, for receiving the input signal to calculate an input signal power to control the first analog-to-digital converter according to a predetermined power value and a sum of the input signal power and a total quantization error power.

2. The sigma-delta modulator of claim 1, wherein when the sum of the input signal power and the total quantization error power is less than the predetermined power value, the first analog-to-digital converter is locked by the controller.

3. The sigma-delta modulator of claim 2, wherein the total quantization error power is generated according to an accumulated quantization error power multiplied by a noise power gain.

4. The sigma-delta modulator of claim 1, wherein when the sum of the input signal power and the total quantization error power is no less than the predetermined power value, the first analog-to-digital converter is unlocked by the controller.

5. The sigma-delta modulator of claim 4, wherein the total quantization error power is generated according to a quantization error power multiplied by a noise power gain.

6. The sigma-delta modulator of claim 1, further comprising a clock unit, for providing a clock signal.

7. The sigma-delta modulator of claim 1, wherein the predetermined power value is the maximum output signal power of the first analog-to-digital converter.

8. The sigma-delta modulator of claim 1, wherein the first analog-to-digital converter is a bit quantizer.

9. The sigma-delta modulator of claim 1, wherein the controller further comprises a second analog-to-digital converter, for converting the input signal into a digital signal.

10. The sigma-delta modulator of claim 9, wherein the controller further comprises a look-up table, for obtaining the input signal power according to the digital signal.

11. The sigma-delta modulator of claim 1, wherein the controller further comprises a state controller for controlling the first analog-to-digital converter.

12. The sigma-delta modulator of claim 1, wherein the controller further comprises a power calculating unit, for obtaining the input signal power.

13. The sigma-delta modulator of claim 1 is utilized in a digital amplifier.

14. A method for reducing an output rate utilized in a sigma-delta modulator, comprising:
receiving an input signal;
obtaining an input signal power according to the input signal;
summing the input signal power and a total quantization error power to obtain an output signal power; and
controlling an analog-to-digital converter according to the output signal power and a predetermined power value.

15. The method of claim 14, further comprising:
locking the analog-to-digital converter when the output signal power is less than the predetermined power value.

16. The method of claim 14, wherein the total quantization error power is generated according to a multiplication of an accumulated quantization error power and a noise power gain.

17. The method of claim 14, further comprising:
unlocking the analog-to-digital converter when the output signal power is no less than the predetermined power value.

18. The method of claim 17, wherein the total quantization error power is generated according to a multiplication of a quantization error power and a noise power gain.

19. The method of claim 14, wherein the predetermined power value is the maximum output signal power of the analog-to-digital converter.

20. The method of claim 14, wherein the analog-to-digital converter is a bit quantizer.

21. The method of claim 14, further comprising:
converting the input signal into a digital signal; and
obtaining the input signal power according to the digital signal and a look-up table.

* * * * *